United States Patent
Liu et al.

(10) Patent No.: US 11,588,021 B2
(45) Date of Patent: Feb. 21, 2023

(54) TRENCH MOSFET AND MANUFACTURING METHOD OF THE SAME

(71) Applicant: Excelliance MOS Corporation, Hsinchu County (TW)

(72) Inventors: Chu-Kuang Liu, Hsinchu County (TW); Yi-Lun Lo, Hsinchu County (TW)

(73) Assignee: Excelliance MOS Corporation, Hsinchu County (TW)

( * ) Notice: Subject to any disclaimer, the term of this patent is extended or adjusted under 35 U.S.C. 154(b) by 0 days.

(21) Appl. No.: 16/830,225

(22) Filed: Mar. 25, 2020

(65) Prior Publication Data

US 2021/0202701 A1 Jul. 1, 2021

(30) Foreign Application Priority Data

Dec. 25, 2019 (TW) ................... 108147542

(51) Int. Cl.
*H01L 29/78* (2006.01)
*H01L 29/10* (2006.01)
(Continued)

(52) U.S. Cl.
CPC ...... *H01L 29/1083* (2013.01); *H01L 21/2253* (2013.01); *H01L 21/26513* (2013.01);
(Continued)

(58) Field of Classification Search
CPC .......... H01L 21/2253; H01L 21/26513; H01L 21/324; H01L 21/823437; H01L 27/2454;
(Continued)

(56) References Cited

U.S. PATENT DOCUMENTS 5,567,634 A * 10/1996 Hebert ................ H01L 29/7813
438/270
6,781,199 B2 * 8/2004 Takahashi ............. H01L 29/407
257/330
(Continued)

FOREIGN PATENT DOCUMENTS

CN 101641763 2/2010
CN 107026205 8/2017
(Continued)

OTHER PUBLICATIONS

"Office Action of Taiwan Counterpart Application", dated Feb. 2, 2021, p. 1-p. 4.

(Continued)

*Primary Examiner* — Mary A Wilczewski
(74) *Attorney, Agent, or Firm* — JCIPRNET

(57) ABSTRACT

A trench MOSFET and a manufacturing method of the same are provided. The trench MOSFET includes a substrate, an epitaxial layer having a first conductive type, a gate in a trench in the epitaxial layer, a gate oxide layer, a source region having the first conductive type, and a body region and an anti-punch through region having a second conductive type. The anti-punch through region is located at an interface between the source region and the body region, and a doping concentration thereof is higher than that of the body region. The epitaxial layer has a first pn junction near the source region and a second pn junction near the substrate. N regions are divided into N equal portions between the two pn junctions, and N is an integer greater than 1. The closer the N regions are to the first pn junction, the greater the doping concentration thereof is.

4 Claims, 4 Drawing Sheets

(51) Int. Cl.
  *H01L 21/225* (2006.01)
  *H01L 21/265* (2006.01)
  *H01L 29/66* (2006.01)
  *H01L 21/324* (2006.01)
  *H01L 21/336* (2006.01)

(52) U.S. Cl.
  CPC ...... *H01L 21/324* (2013.01); *H01L 29/66537* (2013.01); *H01L 29/66734* (2013.01); *H01L 29/7813* (2013.01)

(58) Field of Classification Search
  CPC ............. H01L 29/0615; H01L 29/0623; H01L 29/0684; H01L 29/1083; H01L 29/1095; H01L 29/4236; H01L 29/66537; H01L 29/66666; H01L 29/66734; H01L 29/7813; H01L 29/7827
  See application file for complete search history.

(56) References Cited

U.S. PATENT DOCUMENTS

| | | | |
|---|---|---|---|
| 7,037,788 B2* | 5/2006 | Ito | H01L 29/0696 438/268 |
| 7,388,255 B2* | 6/2008 | Nakano | H01L 29/1083 257/330 |
| 7,394,144 B2* | 7/2008 | Rochefort | H01L 29/0634 257/522 |
| 7,485,921 B2* | 2/2009 | Kawaguchi | H01L 29/0634 257/331 |
| 7,807,536 B2* | 10/2010 | Sreekantham | H01L 29/4958 438/270 |
| 7,964,913 B2* | 6/2011 | Darwish | H01L 29/0649 257/330 |
| 8,723,317 B2 | 5/2014 | Hsieh | |
| 8,735,973 B2 | 5/2014 | Zhang et al. | |
| 8,742,451 B2 | 6/2014 | Seok | |
| 9,018,701 B2 | 4/2015 | Hsieh | |
| 9,929,260 B2* | 3/2018 | Naito | H01L 27/0664 |
| 9,997,593 B2 | 6/2018 | Ding et al. | |
| 10,217,847 B2 | 2/2019 | Seok | |
| 10,586,703 B2* | 3/2020 | Wakimoto | H01L 21/046 |
| 2001/0048132 A1 | 12/2001 | Ito et al. | |
| 2002/0179976 A1 | 12/2002 | Takahashi | |
| 2003/0008460 A1* | 1/2003 | Darwish | H01L 21/2253 257/E29.066 |
| 2006/0202264 A1* | 9/2006 | Bhalla | H01L 29/7811 257/E29.066 |
| 2006/0209887 A1* | 9/2006 | Bhalla | H01L 29/7811 257/E29.066 |
| 2007/0108469 A1* | 5/2007 | Nakano | H01L 29/7825 257/139 |
| 2007/0194375 A1 | 8/2007 | Kawaguchi et al. | |
| 2008/0164516 A1* | 7/2008 | Darwish | H01L 29/0634 257/329 |
| 2008/0164518 A1* | 7/2008 | Darwish | H01L 29/7802 257/331 |
| 2008/0164520 A1* | 7/2008 | Darwish | H01L 29/7835 257/334 |
| 2008/0166845 A1* | 7/2008 | Darwish | H01L 21/28008 438/270 |
| 2008/0265312 A1* | 10/2008 | Bhalla | H01L 29/66734 257/E29.066 |
| 2011/0169103 A1* | 7/2011 | Darwish | H01L 29/0696 257/E29.262 |
| 2012/0080748 A1* | 4/2012 | Hsieh | H01L 29/66734 257/E21.409 |
| 2012/0161226 A1* | 6/2012 | Darwish | H01L 29/7811 257/330 |
| 2012/0175699 A1* | 7/2012 | Hsieh | H01L 29/41766 257/E27.06 |
| 2012/0292694 A1* | 11/2012 | Hsieh | H01L 29/407 438/270 |
| 2012/0302021 A1* | 11/2012 | Bhalla | H01L 29/7813 438/270 |
| 2013/0009238 A1* | 1/2013 | Bhalla | H01L 29/7806 438/570 |
| 2013/0168762 A1* | 7/2013 | Darwish | H01L 29/0634 257/330 |
| 2013/0267080 A1* | 10/2013 | Darwish | H01L 21/2658 438/478 |
| 2013/0280870 A1 | 10/2013 | Bhalla et al. | |
| 2014/0070308 A1* | 3/2014 | Darwish | H01L 21/324 257/330 |
| 2014/0077290 A1* | 3/2014 | Hsieh | H01L 29/0869 438/270 |
| 2014/0183625 A1* | 7/2014 | Darwish | H01L 29/66666 257/330 |
| 2014/0199814 A1* | 7/2014 | Darwish | H01L 29/7813 438/270 |
| 2014/0203354 A1* | 7/2014 | Darwish | H01L 29/0649 257/329 |
| 2015/0270375 A1* | 9/2015 | Darwish | H01L 21/76224 438/270 |
| 2016/0104702 A1* | 4/2016 | Hsieh | H01L 29/4916 257/334 |
| 2016/0190309 A1 | 6/2016 | Yilmaz et al. | |
| 2016/0351665 A1* | 12/2016 | Sugimoto | H01L 29/7811 |
| 2017/0221714 A1* | 8/2017 | Wakimoto | H01L 21/26506 |
| 2017/0373185 A1 | 12/2017 | Yilmaz et al. | |
| 2019/0051743 A1* | 2/2019 | Darwish | H01L 21/02164 |
| 2019/0237576 A1* | 8/2019 | Qiao | H01L 29/4236 |
| 2019/0355808 A1* | 11/2019 | Toyoda | H01L 27/0922 |
| 2020/0243656 A1* | 7/2020 | Shibib | H01L 29/407 |
| 2021/0028305 A1* | 1/2021 | Hsieh | H01L 29/66734 |
| 2021/0126124 A1* | 4/2021 | Hsieh | H01L 29/42368 |
| 2021/0202701 A1* | 7/2021 | Liu | H01L 21/324 |
| 2022/0149161 A1* | 5/2022 | Hsieh | H01L 29/7813 |

FOREIGN PATENT DOCUMENTS

| | | | | |
|---|---|---|---|---|
| TW | | 201535719 | | 9/2015 |
| TW | | 201611183 | | 3/2016 |
| TW | | 201622015 | | 6/2016 |
| TW | | 201631739 | | 9/2016 |
| TW | | 201843833 | | 12/2018 |
| TW | | 201909419 | | 3/2019 |
| WO | WO 2017/043606 | | * 3/2017 | ......... H01L 29/4236 |

OTHER PUBLICATIONS

"Office Action of China Counterpart Application", dated Feb. 23, 2022, p. 1-p. 7.

* cited by examiner

US 11,588,021 B2

TRENCH MOSFET AND MANUFACTURING METHOD OF THE SAME

CROSS-REFERENCE TO RELATED APPLICATION

This application claims the priority benefit of Taiwan application serial no. 108147542, filed on Dec. 25, 2019. The entirety of the above-mentioned patent application is hereby incorporated by reference herein and made a part of this specification.

BACKGROUND OF THE INVENTION

Field of the Invention

The invention relates to a power semiconductor device, and more particularly, to a trench metal-oxide semiconductor field effect transistor (MOSFET) and a manufacturing method of the same.

Description of Related Art

Among power semiconductor devices, power semiconductor devices vertically disposed in trenches have become one of the focuses of development in various industries because they may significantly increase cell density.

FIG. 1 is a diagram of a conventional trench MOSFET. In FIG. 1, a source region 104 and a body region 106 are in an epitaxial layer 102 on a substrate 100, a trench gate 108 is disposed in the epitaxial layer 102, and an inner dielectric layer (ILD) 110 covers the epitaxial layer 102 and the trench gate 108. In addition, a gate oxide layer 112 is on the surface of the trench gate 108.

FIG. 2 is a graph of doping concentration along a sidewall 108a of the trench gate structure 108 of FIG. 1, wherein it is shown that the doping concentration distribution between the source region 104 and the body region 106 is mild, so that the body resistance is higher. Once the body resistance is high, the parasitic N (source 104)-P (body 106)-N (epitaxial layer 102) bipolar transistor is easily turned on, and secondary breakdown occurs to the MOSFET so that device temperature is increased, thus causing permanent damage to the device. That is, unclamped inductive switching (UIS) performance is worsened.

SUMMARY OF THE INVENTION

The invention provides a trench MOSFET. An anti-punch through region with a specific doping concentration range is provided between the body and the source thereof to reduce the resistivity of the body, thereby improving the UIS capabilities of the trench MOSFET.

The invention further provides a manufacturing method of a trench MOSFET that may generate a high doping concentration region between the body and the source to reduce body resistivity ($Rs_{\_Body}$) to prevent the parasitic bipolar transistor from turning on.

The trench MOSFET of the invention includes a substrate, an epitaxial layer having a first conductivity type, a gate, a gate oxide layer, a source region having the first conductivity type, a body region having a second conductivity type, and an anti-punch through region having the second conductivity type. The epitaxial layer is formed on the substrate. The epitaxial layer has a trench, the gate is located in the trench, and the gate oxide layer is located between the gate and the trench. The source region is located on a surface of the epitaxial layer on two sides of the trench, the body region is located in a portion of the epitaxial layer below the source region, and the anti-punch through region is located at an interface of the body region and the source region, wherein a doping concentration of the anti-punch through region is higher than a doping concentration of the body region. The epitaxial layer has one first pn junction near the source region and one second pn junction near the substrate, and N regions are divided into N equal portions between the first pn junction and the second pn junction, and N is an integer greater than 1. The closer the N regions are to the first pn junction, the greater a doping concentration thereof is. Each of the N regions has an integrated area of doping concentration, and the closer the N regions are to the first pn junction, the greater the integrated area of doping concentration thereof is.

In an embodiment of the invention, N is 2, and the N regions include a first region near the first pn junction and a second region near the second pn junction, a doping concentration in the first region is greater than a doping concentration in the second region, and an integrated area of doping concentration of the first region is greater than an integrated area of doping concentration of the second region.

In an embodiment of the invention, N is 3, and the N regions include a first region near the first pn junction, a third region near the second pn junction, and a second region between the first region and the third region, a doping concentration in the first region is greater than a doping concentration in the second region, the doping concentration in the second region is greater than a doping concentration in the third region, an integrated area of doping concentration of the first region is greater than an integrated area of doping concentration of the second region, and the integrated area of doping concentration of the second region is greater than an integrated area of doping concentration of the third region.

The manufacturing method of a trench MOSFET of the invention includes the following steps. A trench gate is formed in an epitaxial layer having a first conductivity type on a substrate. A step of performing a plurality of implantations of a dopant having a second conductivity type is performed on the epitaxial layer in a manner that an implantation dose is gradually reduced toward a direction of the substrate. A first drive-in step is performed to diffuse the dopant having the second conductivity type in an upper half of the epitaxial layer to form a body region having the second conductivity type. A dopant having the first conductivity type is implanted on a surface of the epitaxial layer. A second drive-in step is performed to diffuse the dopant having the first conductivity type to form a source region. After the source region is formed, the dopant having the second conductivity type is comprehensively implanted at an interface of the body region and the source region to form an anti-punch through region, wherein a doping concentration of the anti-punch through region is higher than a doping concentration of the body region.

In another embodiment of the invention, the step of performing a plurality of implantations of the dopant having the second conductivity type includes two or three implantations.

In another embodiment of the invention, an energy of implanting the dopant having the first conductivity type is, for example, between 20 KeV and 45 KeV.

In another embodiment of the invention, the second drive-in step includes rapid thermal processing (RTP).

In another embodiment of the invention, the step of forming the trench gate includes the steps of first forming a trench in the epitaxial layer, forming a gate oxide layer on a surface of the trench, and depositing a conductor in the trench as a gate.

In various embodiments of the invention, the doping concentration of the anti-punch through region is between 5E+16 atoms/cm$^3$ and 5E+17 atoms/cm$^3$.

In various embodiments of the invention, the first conductivity type is N-type, and the second conductivity type is P-type.

In various embodiments of the invention, the first conductivity type is P-type, and the second conductivity type is N-type.

Based on the above, in the invention, via the anti-punch through region formed between the body and the source, a steep concentration distribution is achieved and thereby body resistivity is reduced to prevent the parasitic bipolar transistor from turning on and improve the UIS capabilities of the trench MOSFET.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
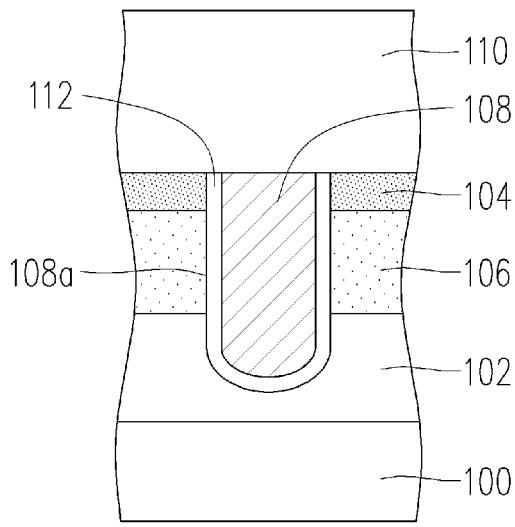
FIG. 1 is a diagram of a conventional trench MOSFET.
Figure 2:
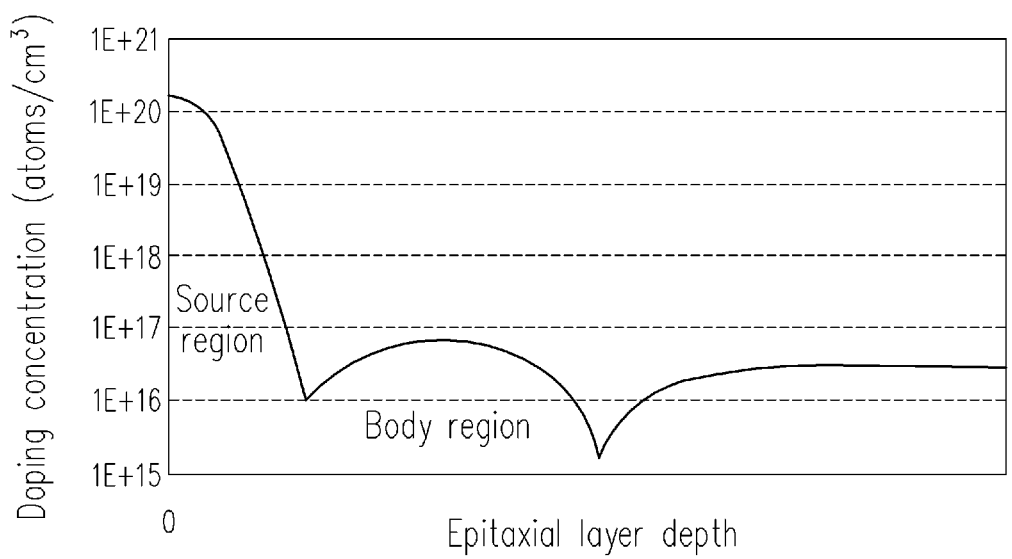
FIG. 2 is a graph of doping concentration along a sidewall of the trench gate structure of FIG. 1.

The disclosure below provides numerous different embodiments or examples for implementing different features of the invention. Of course, these embodiments are only examples, and are not intended to limit the scope and application of the invention. Moreover, for the sake of clarity, the relative thickness and position of each element, film layer, or region may be reduced or enlarged. In addition, similar or identical reference numerals are used in each drawing to indicate similar or identical devices or features, and if there are identical reference numerals in the drawings, descriptions thereof will be omitted.

Figure 3:
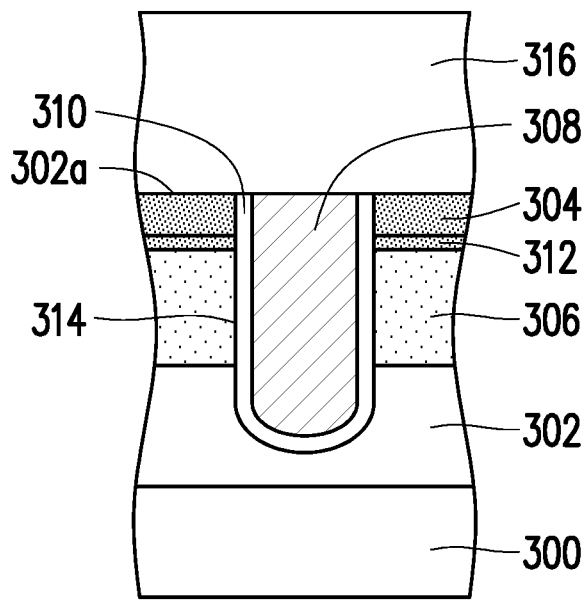
FIG. 3 is a diagram of a trench MOSFET according to the first embodiment of the invention.

FIG. 3 is a diagram of a trench MOSFET according to the first embodiment of the invention.

Referring to FIG. 3, the trench MOSFET of the first embodiment includes a substrate 300, an epitaxial layer 302 having a first conductivity type, a source region 304 having the first conductivity type, a body region 306, a gate 308, a gate oxide layer 310 having a second conductivity type, and an anti-punch through region 312 having the second conductivity type. In the present embodiment, the first conductivity type is N-type, and the second conductivity type is P-type. However, the invention is not limited thereto. In another embodiment, the first conductivity type may be P-type, and the second conductivity type may be N-type. The epitaxial layer 302 is formed on the substrate 300, and the epitaxial layer 302 has a trench 314. Although FIG. 3 shows only one trench 314, it should be understood that the trench MOSFET for power devices actually has a plurality of trenches 314.

Please continue to refer to FIG. 3, the gate 308 is located in the trench 314, and the gate oxide layer 310 is located between the gate 308 and the trench 314. The source region 304 is located on a surface 302a of the epitaxial layer 302 on two sides of the trench 314, and the body region 306 is located in a portion of the epitaxial layer 302 below the source region 304. Generally, if the epitaxial layer 302 is an N-type epitaxial, the source region 304 is an N+ region. The anti-punch through region 312 is located at the interface of the body region 306 and the source region 304, wherein the doping concentration of the anti-punch through region 312 needs to be higher than the doping concentration of the body region 306. That is, if the body region 306 is a P-type well region, the anti-punch through region 312 is a P+ region relatively. In an embodiment, the doping concentration of the anti-punch through region 312 is, for example, between 5E+16 atoms/cm$^3$ and 5E+17 atoms/cm$^3$. In addition, an inner dielectric layer 316 may be formed to cover the epitaxial layer 302 and the gate 308.

Figure 4:
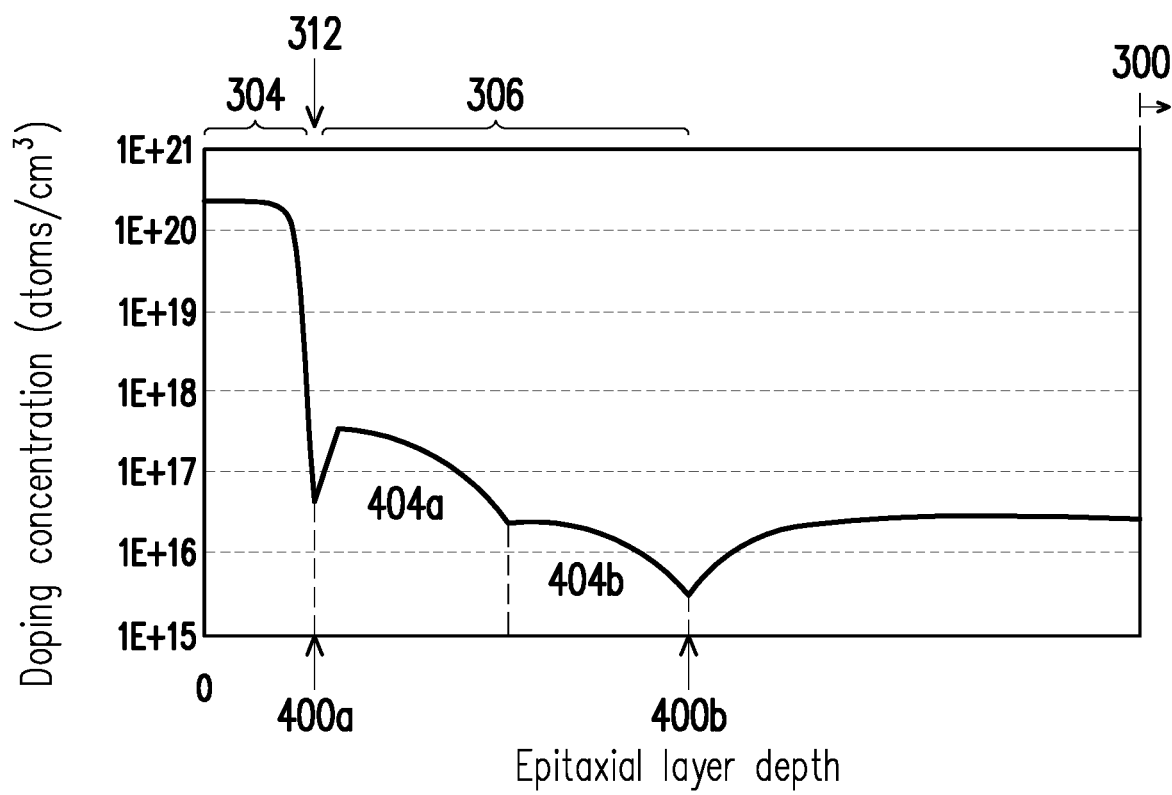
FIG. 4 is a graph of a doping concentration along a sidewall of the trench gate structure of FIG. 3.

FIG. 4 is a graph of a doping concentration along a sidewall of the trench gate structure of FIG. 3.

In FIG. 4, the epitaxial layer has one first pn junction 400a near the source region 304 and one second pn junction 400b near the substrate 300. Two equal portions are divided between the first pn junction 400a and the second pn junction 400b. The portion near the first pn junction 400a is set as a first region 404a and the portion near the second pn junction 400b is set as the second region 404b. However, the invention is not limited thereto. N portions may be divided between the first pn junction 400a and the second pn junction 400b, and N may be other integers greater than 1 besides 2. In FIG. 4, the doping concentration in the first region 404a is greater than the doping concentration in the second region 404b, and the first region 404a has an integrated area of first doping concentration, the second region 404b has an integrated area of second doping concentration, and the integrated area of first doping concentration is greater than the integrated area of second doping concentration. Moreover, the anti-punch through region 312 located at the interface of the body region 306 and the source region 304 has a steep concentration distribution, so that the body resistivity here is reduced, thereby improving the UIS capabilities of the trench MOSFET. That is, in the invention, the closer the region is to the first pn junction 400a, the greater the doping concentration thereof is, and the closer the region is to the first pn junction 400a, the greater the integrated area of doping concentration thereof is. The manufacturing method of such a special doping concentration distribution is described later.

Figure 5:
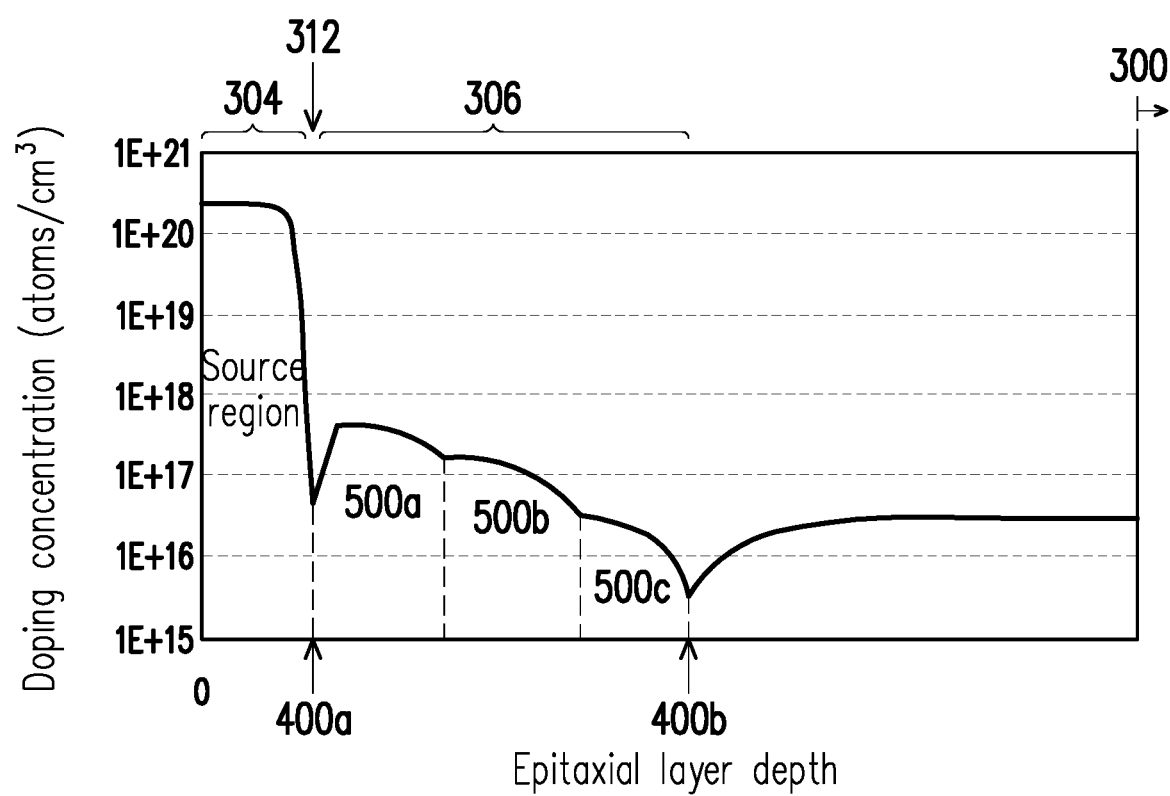
FIG. 5 is a graph of another doping concentration along the sidewall of the trench gate structure of FIG. 3.

FIG. 5 is another doping concentration curve of the trench sidewall of the device of FIG. 3, wherein the same reference numerals as in FIG. 4 are used to indicate the same or similar regions, and the same or similar regions are as provided above and are not repeated herein.

The difference between FIG. 5 and FIG. 4 is that three equal portions are divided between the first pn junction 400a and the second pn junction 400b, i.e., a first region 500a near the first pn junction 400a, a third region 500c near the second pn junction 400b, and a second region 500b between the first region 500a and the third region 500c. The doping concentration in the first region 500a is greater than the doping concentration in the second region 500b, the doping concentration in the second region 500b is greater than the doping concentration in the third region 500c, the integrated area of doping concentration of the first region 500a is greater than the integrated area of doping concentration of the second region 500b, and the integrated area of doping concentration of the second region 500b is greater than the integrated area of doping concentration of the third region 500c. The manufacturing method of the doping concentration distribution is also described below.

Figure 6:
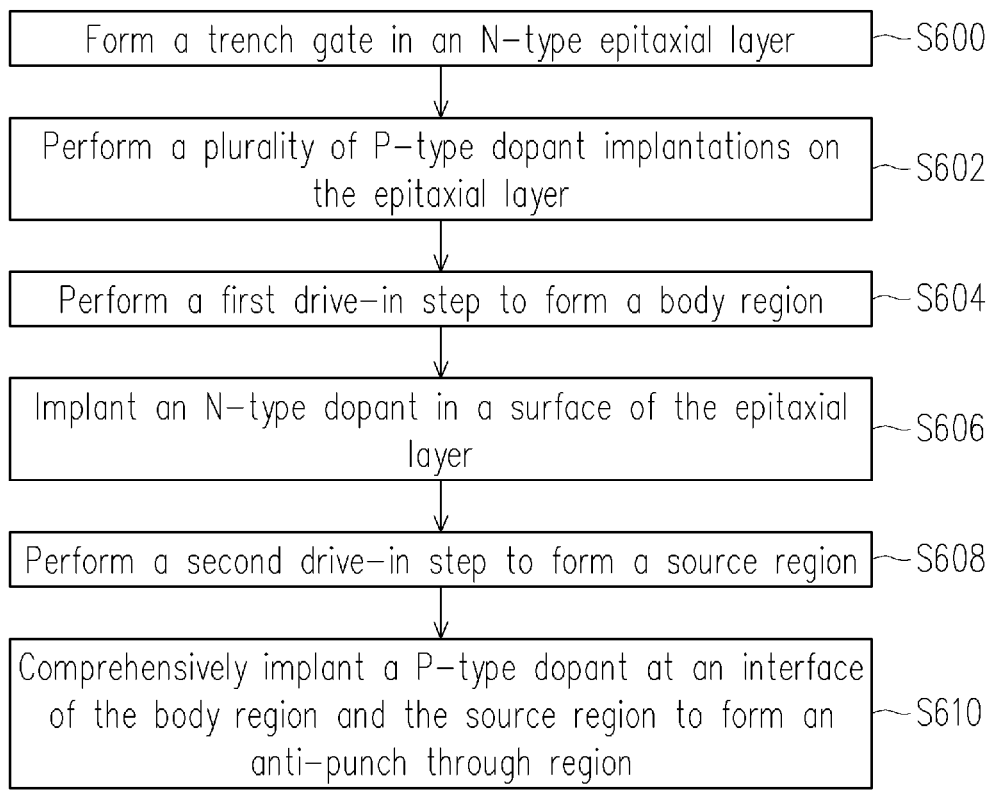
FIG. 6 is a manufacturing process flowchart of a trench MOSFET according to the second embodiment of the invention.

FIG. 6 is a manufacturing process flowchart of a trench MOSFET according to the second embodiment of the invention. Moreover, according to the steps of the second embodiment, a doping concentration distribution as shown in FIG. 4 or FIG. 5 may be produced.

Referring to FIG. 6, step S600 is first performed to form a trench gate in an epitaxial layer having a first conductivity type on a substrate. In the present embodiment, the first conductivity type is N-type, and the second conductivity type is P-type; and vice versa. The steps of forming the trench gate may be exemplified but not limited to: first forming a trench in the N-type epitaxial layer, forming a gate oxide layer on the surface of the trench, and then depositing a conductor in the trench as a gate, wherein the conductor is, for example, polysilicon.

Next, in step S602, a step of a plurality of implantations of a dopant having the second conductivity type is performed on the epitaxial layer in a manner that the implantation dose is gradually reduced in a direction toward the substrate. In the present embodiment, the implantation step may be a step of two or three implantations of a P-type dopant.

Then, in step S604, a first drive-in step is performed to diffuse the P-type dopant in the upper half of the N-type epitaxial layer to form a P-type body region. In addition, in order to avoid the mild N-type concentration at the bottom of the source region and the mild P-type concentration of the body region, the concentrations at the first pn junction compensate each other, resulting in an increase in the resistivity of the body region. In the invention, by reducing the thermal budget of the process, the doping concentration distribution in the body region is close to the concentration distribution after the implantation step in step S602. For example, if the conventional drive-in step is a high-temperature and long-time process (for example, higher than 1000° C. for one hour), then step S604 adopts a high-temperature and short time (for example, higher than 1000° C. for 30 minutes or less) or the temperature is reduced and the time is shortened at the same time (such as 1000° C. or less and less than one hour). That is, when there are two implantations in step S602, the impurity concentration distribution of the formed body region is shown in FIG. 4. Moreover, if there are three implantations in step S602, the doping concentration distribution of the formed body region is as shown in FIG. 5.

Subsequently, in step S606, a dopant having a first conductivity type (such as N-type) is implanted on the surface of the epitaxial layer. Moreover, in order to have a steeper doping concentration distribution in the source region formed later, the energy of the implantation step is lower than the implantation performed in the conventional forming of the source region, for example, between 20 KeV and 45 KeV. However, the invention is not limited thereto. According to the design criteria of the trench MOSFET, the energy of the implantation step may be changed.

Next, in step S608, a second drive-in step is performed to diffuse a dopant having the first conductivity type (such as N-type) to form a source region. Similarly, in order to make the source region have a steeper doping concentration distribution, the process of the invention needs to further reduce the thermal budget, so the time of the second drive-in step needs to be shorter than the conventional drive-in step, for example, 5 minutes or less. For example, the second drive-in step may adopt rapid thermal processing (RTP).

Then, step S610 is performed after step S608. Without any photoresist mask, a dopant having the second conductivity type (such as P-type) is comprehensively implanted at the interface of the body region and the source region to form an anti-punch through region, wherein the doping concentration of the anti-punch through region is higher than the doping concentration of the body region, and a high-temperature drive-in step is not performed subsequently, so that a steep concentration distribution is formed at the interface of the body region and the source region as depicted by the straight line on the left side (toward the source region 304) of the first pn junction 400a in FIG. 4 and FIG. 5. In the present embodiment, the doping concentration of the anti-punch through region is, for example, between 5E+16 atoms/cm$^3$ and 5E+17 atoms/cm$^3$. However, the invention is not limited thereto. According to the size of the doping concentration of the body region, the doping concentration of the anti-punch through region may also be changed. Subsequent processes may be performed according to existing techniques and are not repeated herein.

Based on the above, in the invention, a special doping concentration distribution is formed between the body and the source via process control, thereby reducing the body resistivity and thereby improving the UIS capabilities of the trench MOSFET.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A trench MOSFET, comprising:
   a substrate;
   an epitaxial layer having a first conductivity type formed on the substrate, and the epitaxial layer has a trench;
   a gate located in the trench;
   a gate oxide layer located between the gate and the trench;
   a source region having the first conductivity type located on a surface of the epitaxial layer on two sides of the trench;
   a body region having a second conductivity type located in a portion of the epitaxial layer below the source region; and
   an anti-punch through region having the second conductivity type located at an interface of the body region and the source region, wherein a doping concentration of the anti-punch through region is higher than a doping concentration of the body region,
   wherein the epitaxial layer has a first pn junction at an interface of the anti-punch through region and the source region and a second pn junction near the substrate, a region in the body region closest to the first pn junction is at an interface of the body region and the anti-punch through region, and N regions are divided into N equal portions according to a depth of the epitaxial layer between the first pn junction and the second pn junction, wherein N is 3, and the N regions comprise a first region near the first pn junction, a third region near the second pn junction, and a second region between the first region and the third region, a doping concentration in the first region is greater than a doping concentration in any other region of the second region, the doping concentration in the second region is greater than a doping concentration in the third region, an integrated area of doping concentration to the depth of the epitaxial layer of the first region is greater than an integrated area of doping concentration to the depth of the epitaxial layer of the second region, and the integrated area of doping concentration to the depth of the epitaxial layer of the second region is greater than an integrated area of doping concentration to the depth of the epitaxial layer of the third region, wherein the closer the N regions are to the first pn junction, the greater a doping concentration thereof is, and wherein each of the N regions has an integrated area of doping concentration to the depth of the epitaxial layer, and the closer the N regions are to the first pn junction, the greater the integrated area of doping concentration thereof is, wherein the region in the body region closest to the first pn junction has a higher doping concentration than other adjacent regions in the body region.

2. The trench MOSFET of claim 1, wherein the doping concentration of the anti-punch through region is between 5E+16 atoms/cm$^3$ and 5E+17 atoms/cm$^3$.

3. The trench MOSFET of claim 1, wherein the first conductivity type is N-type and the second conductivity type is P-type.

4. The trench MOSFET of claim 1, wherein the first conductivity type is P-type and the second conductivity type is N-type.

* * * * *